US010134795B2

United States Patent
Fujii et al.

(10) Patent No.: US 10,134,795 B2
(45) Date of Patent: *Nov. 20, 2018

(54) SEMICONDUCTOR DEVICE WITH MULTIPLE SUBSTRATES ELECTRICALLY CONNECTED THROUGH AN INSULATING FILM AND MANUFACTURING METHOD

(71) Applicant: Sony Corporation, Tokyo (JP)

(72) Inventors: Nobutoshi Fujii, Kanagawa (JP);
Yoshiya Hagimoto, Kanagawa (JP);
Kenichi Aoyagi, Kanagawa (JP);
Yoshihisa Kagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 1 day.

This patent is subject to a terminal disclaimer.

(21) Appl. No.: 15/607,845

(22) Filed: May 30, 2017

(65) Prior Publication Data

US 2017/0263666 A1 Sep. 14, 2017

Related U.S. Application Data

(63) Continuation of application No. 14/880,957, filed on Oct. 12, 2015, now Pat. No. 9,666,627, which is a
(Continued)

(30) Foreign Application Priority Data

Mar. 22, 2013 (JP) ................................ 2013-060691

(51) Int. Cl.
*H01L 27/146* (2006.01)
*H01L 21/20* (2006.01)
(Continued)

(52) U.S. Cl.
CPC .... *H01L 27/14636* (2013.01); *H01L 21/2007* (2013.01); *H01L 21/76823* (2013.01);
(Continued)

(58) Field of Classification Search
CPC ................... H01L 21/2007; H01L 27/14636
See application file for complete search history.

(56) References Cited

U.S. PATENT DOCUMENTS

| 2012/0153484 A1* | 6/2012 | Sadaka | H01L 21/76826 257/762 |
| 2013/0105924 A1* | 5/2013 | Kobayashi | H01L 27/14632 257/431 |

FOREIGN PATENT DOCUMENTS

CN 102543778 A 7/2012

OTHER PUBLICATIONS

Official Action (and its English translation) issued in Chinese Application No. 201410095150.5 dated May 31, 2017, 15 pages.

* cited by examiner

*Primary Examiner* — Daniel Luke
(74) *Attorney, Agent, or Firm* — Sheridan Ross P.C.

(57) ABSTRACT

A semiconductor device includes a first substrate having an attaching surface on which first electrodes and a first insulating film are exposed, an insulating thin film that covers the attaching surface of the first substrate, and a second substrate which has an attaching surface on which second electrodes and a second insulating film are exposed and is attached to the first substrate in a state in which the attaching surface of the second substrate and the attaching surface of the first substrate are attached together sandwiching the insulating thin film therebetween, and the first electrodes and the second electrodes deform and break a part of the insulating thin film so as to be directly electrically connected to each other.

7 Claims, 8 Drawing Sheets

Related U.S. Application Data continuation of application No. 14/206,489, filed on Mar. 12, 2014, now Pat. No. 9,190,275.

(51) Int. Cl.
*H01L 21/768* (2006.01)
*H04N 5/225* (2006.01)

(52) U.S. Cl.
CPC .. *H01L 21/76828* (2013.01); *H01L 21/76864* (2013.01); *H01L 27/1464* (2013.01); *H01L 27/1469* (2013.01); *H01L 27/14612* (2013.01); *H01L 27/14618* (2013.01); *H01L 27/14634* (2013.01); *H01L 27/14643* (2013.01); *H01L 27/14689* (2013.01); *H04N 5/2254* (2013.01)

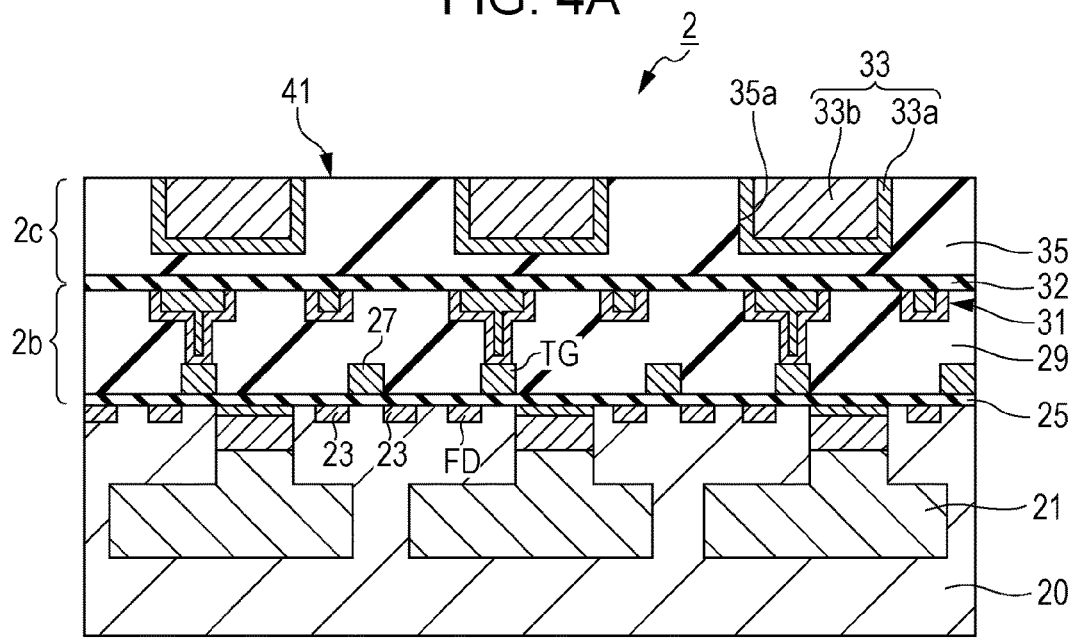
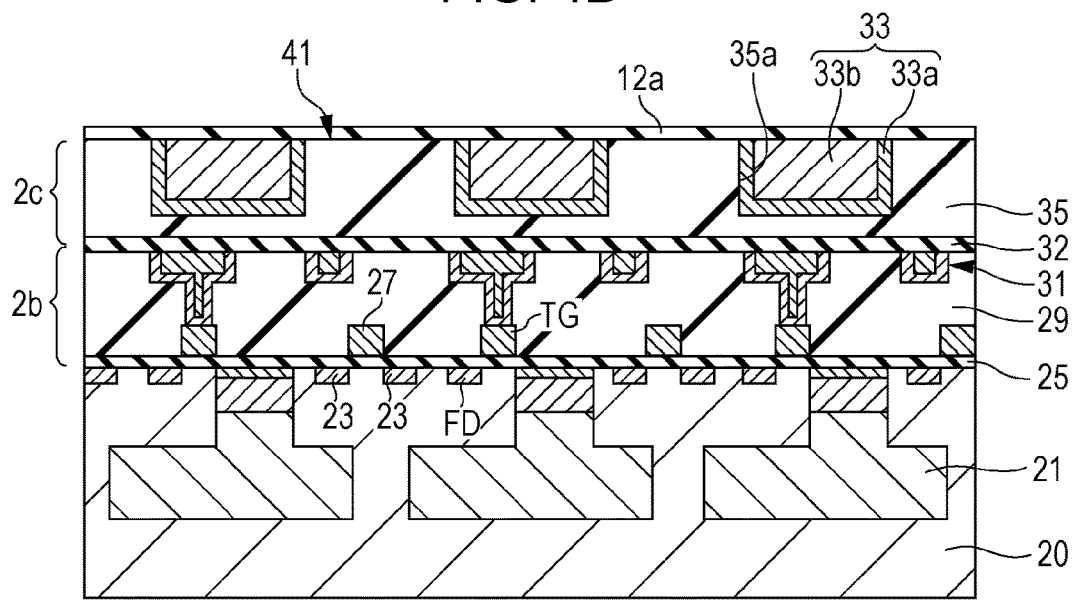

SEMICONDUCTOR DEVICE WITH MULTIPLE SUBSTRATES ELECTRICALLY CONNECTED THROUGH AN INSULATING FILM AND MANUFACTURING METHOD

CROSS REFERENCE TO RELATED APPLICATIONS

This application is a continuation of U.S. patent application Ser. No. 14/880,957, filed Oct. 12, 2015, now U.S. Pat. No. 9,666,627, which is a continuation of U.S. patent application Ser. No. 14/206,489, filed Mar. 12, 2014, now U.S. Pat. No. 9,190,275, which claims the benefit of Japanese Priority Patent Application JP 2013-060691 filed Mar. 22, 2013, the entire disclosures of which are hereby incorporated herein by reference.

BACKGROUND

The present disclosure relates to a semiconductor device and a manufacturing method, and particularly to a semiconductor device configured by attaching two substrates in a state in which electrodes are electrically joined to each other and a manufacturing method thereof.

Thus far, two-dimensionally structured semiconductor devices have been highly integrated by introducing fine processes and improving mounting density, but there is a physical limitation in highly integrating two-dimensional structures using the above-described method. Therefore, three-dimensionally structured semiconductor devices have been developed to further decrease the size of semiconductor devices and further increase the density of pixels. For example, a three-dimensionally structured semiconductor device obtained by stacking a sensor substrate having photoelectric conversion portions and a circuit substrates having peripheral circuit portions and attaching both substrates together is proposed in Japanese Unexamined Patent Application Publication No. 2006-191081.

The above-described three-dimensionally structured semiconductor device is produced by using two substrates having an attaching surface on which a Cu electrode and an insulating film are exposed, aligning the Cu electrodes in a state in which the attaching surfaces face each other, and, furthermore, thermally treating the Cu electrodes, thereby attaching the substrates together. As described above, there are three-dimensionally structured semiconductor devices obtained by stacking and attaching substrates together through direct joining of the Cu electrodes (Cu—Cu junction) (for example, refer to Japanese Unexamined Patent Application Publication No. 2000-299379, Japanese Unexamined Patent Application Publication No. 2006-522461, Japanese Unexamined Patent Application Publication No. 2010-129576, and Japanese Unexamined Patent Application Publication No. 2012-256736)

SUMMARY

However, in the above-described three-dimensionally structured semiconductor devices, a joining surface between the Cu electrode and the insulating film is formed due to deviation occurring when aligning the Cu electrodes during the manufacturing processes, the difference in the shape or size between the Cu electrodes, and the like. In the joining surface between the Cu electrode and the insulating film, voids are generated. Thus, there is a problem in that the substrates are separated due to a decrease in the attaching strength of the joining surface.

The present disclosure has been made in consideration of the above-described circumstances, and enables the provision of a three-dimensionally structured semiconductor device in which the attaching strength between substrates is improved from preventing the generation of voids in a joining surface of the substrates in a configuration in which two substrates are attached together so as to join electrodes.

A semiconductor device according to a first embodiment of the present disclosure includes a first substrate having an attaching surface on which first electrodes and a first insulating film are exposed, an insulating thin film that covers the attaching surface of the first substrate, and a second substrate which has an attaching surface on which second electrodes and a second insulating film are exposed and is attached to the first substrate in a state in which the attaching surface of the second substrate and the attaching surface of the first substrate are attached together sandwiching the insulating thin film therebetween, and the first electrodes and the second electrodes deform and break a part of the insulating thin film so as to be directly electrically connected to each other.

The insulating thin film may be an oxidized film.

The insulating thin film may be a nitride film.

The insulating thin film may have a laminate structure.

The insulating thin film may be provided in a state of covering the entire attaching surfaces, and then only the attaching surfaces between the electrodes are deformed and broken.

The attaching surface of the first substrate and the attaching surface of the second substrate may be flattened surfaces.

A manufacturing method according to a second embodiment of the present disclosure includes forming an insulating thin film in a state in which the attaching surface of at least one of the two substrates having an attaching surface on which electrodes and an insulating film are exposed is covered, disposing the attaching surfaces of the two substrates opposite to each other through the insulating thin film, and aligning the attaching surfaces in a state in which the electrodes on the two substrates are electrically connected to each other through the insulating thin film, thereby attaching the two substrates.

The two attached substrates may be thermally treated so that the insulating thin film sandwiched by the first electrodes and the second electrodes is broken by deforming and moving metal that configures the electrodes, thereby bringing the first electrodes and the second electrodes into direct contact.

The temperature of the thermal treatment may be set to be sufficiently lower than a film-forming temperature of at least one of the first electrodes and the second electrodes.

The insulating thin films may be formed on both of the two substrates.

The insulating thin films made of the same material may be formed both of on the two substrates.

The insulating thin films may be formed using atomic layer deposition.

The attaching surfaces of the two substrates may be formed using a flattening treatment.

According to the present disclosure, in a configuration in which two substrates are attached so as to connect electrodes to each other, it is possible to prevent voids from being generated in a joining interface, and therefore the joining strength between two substrates increases so that it becomes possible to obtain semiconductor devices having improved reliability.

BRIEF DESCRIPTION OF THE DRAWINGS

FIGS. 4A and 4B are cross-sectional process charts illustrating a (second) production order of the first substrate (sensor substrate) when manufacturing the semiconductor device according to the present embodiment;

DETAILED DESCRIPTION OF EMBODIMENTS

Hereinafter, embodiments of the present disclosure will be described in the following order based on the accompanying drawings.

Figure 1:
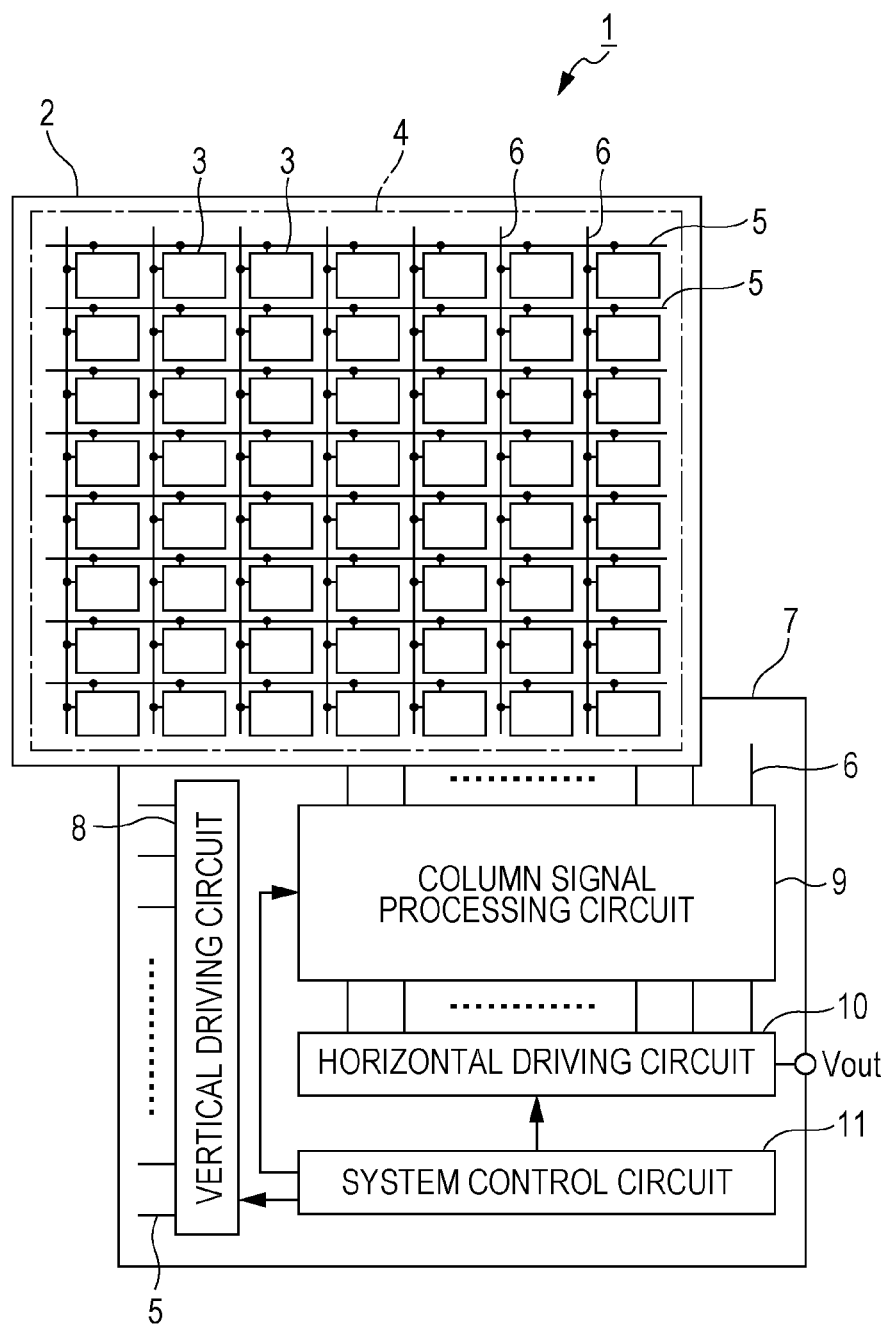
FIG. 1 is a schematic configuration view illustrating an example of a semiconductor device to which the present disclosure is applied.

1. An example of a schematic configuration of a semiconductor device of the present embodiment 2. A configuration of the semiconductor device of the present embodiment 3. A production order of a first substrate (sensor substrate) in manufacturing the semiconductor device of the present embodiment 4. A production order of a second substrate (circuit substrate) in manufacturing the semiconductor device of the present embodiment 5. An attachment order of the substrates in manufacturing the semiconductor device of the present embodiment 6. An example of an electronic device for which the semiconductor device of the present embodiment is used 1. An example of a schematic configuration of a semiconductor device of the present embodiment FIG. 1 illustrates a schematic configuration of a solid imaging apparatus as an example of the semiconductor device to which the present disclosure is applied.

The solid imaging apparatus 1 is a so-called three-dimensionally structured semiconductor device including a first substrate 2 as a sensor substrate and a second substrate 7 as a circuit substrate which is attached in a state of being stacked on the first substrate 2.

Among the above-described components, the first substrate 2 is provided with a pixel region 4 in which a plurality of pixels 3 including a photoelectric conversion portion is arrayed two-dimensionally on a regular basis. In the pixel region 4, a plurality of pixel-driving lines 5 is disposed in a row direction, a plurality of vertical signal lines 6 is disposed in a column direction, and each of the pixels 3 is disposed in a state of being connected to one pixel-driving line 5 and one vertical signal line 6. Each of the pixels 3 is provided with the photoelectric conversion portion, a floating diffusion and a pixel circuit made up of a plurality of transistors (so-called MOS transistors), capacity elements and the like. Meanwhile, there are cases in which a part of the pixel circuit is shared by a plurality of the pixels.

In addition, the second substrate 7 is provided with peripheral circuits such as a vertical driving circuit 8 for driving the respective pixels 3 provided in the first substrate 2, a column signal-processing circuit 9, a horizontal driving circuit 10 and a system control circuit 11.

2. A configuration of the semiconductor device of the present embodiment

Figure 2:
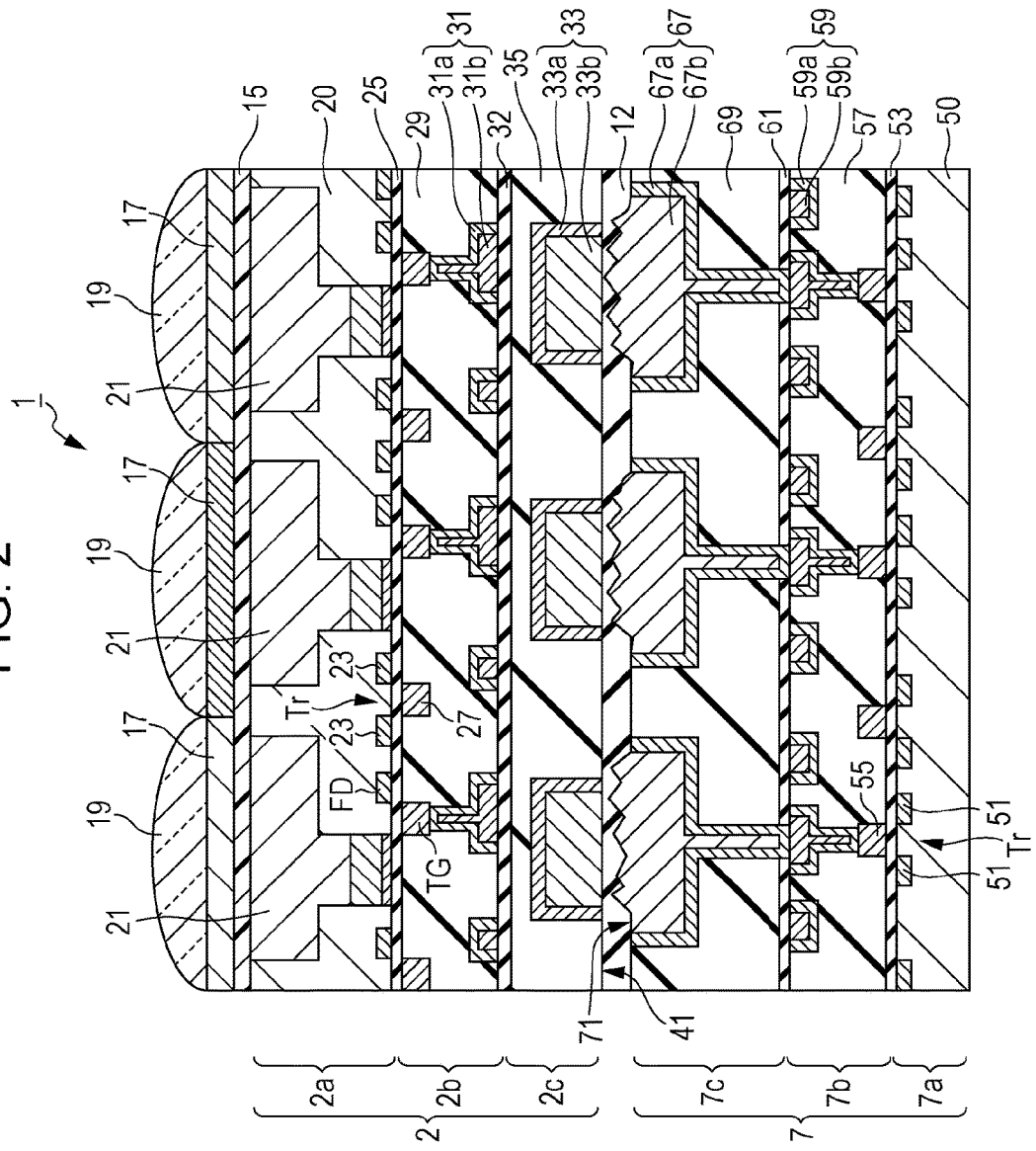
FIG. 2 is a cross-sectional view of main parts illustrating a configuration of a semiconductor device according to the present embodiment.

FIG. 2 is a cross-sectional view of main parts illustrating the configuration of the semiconductor device according to the present embodiment, and is a cross-sectional view of three pixels in FIG. 1. Hereinafter, the detailed configuration of the semiconductor device of the present embodiment will be described based on the above-described cross-sectional view of main parts.

The semiconductor device 1 illustrated in FIG. 2 is a three-dimensionally structured solid imaging apparatus in which an attaching surface 41 of the first substrate 2 and an attaching surface 71 of the second substrate 7 are disposed opposite to each other in a state of sandwiching an insulating thin film 12 so that the first substrate 2 and the second substrate 7 are attached together.

Here, in the first substrate 2, a semiconductor layer 2a, a wire layer 2b and an electrode layer 2c are sequentially stacked from the opposite side of the second substrate 7, and, furthermore, the surface of the electrode layer 2c serves as the attaching surface 41 with respect to the second substrate 7. On the other hand, in the second substrate 7, a semiconductor layer 7a, a wire layer 7b and an electrode layer 7c are sequentially stacked from the opposite side of the first substrate 2, and, furthermore, the surface of the electrode layer 7c serves as the attaching surface 71 with respect to the first substrate 2.

In addition, a protective film 15, color filter layers 17 and on-chip lenses 19 are stacked on the surface of the first substrate 2 on the opposite side of the second substrate 7 in an order illustrated in the drawing.

Next, the detailed configurations of the respective layers that configure the first substrate 2 and the second substrate 7 and the insulating thin film 12 will be sequentially described, and, furthermore, the configurations of the protective film 15, the color filter layer 17 and the on-chip lens 19 will be sequentially described.

Semiconductor Layer 2a (on the First Substrate 2 Side)

The semiconductor layer 2a on the first substrate 2 side is obtained by, for example, making a semiconductor substrate 20 made of single-crystal silicon into a thin film. In the semiconductor layer 2a, a photoelectric conversion portion 21 made of, for example, an n-type impurity layer (or a p-type impurity layer) is provided to each pixel on a first surface side on which the color filter layers 17, the on-chip lenses 19 and the like are disposed. On the other hand, floating diffusions FD made of an $n^+$-type impurity layer, sources and drains 23 of transistors Tr, furthermore, other impurity layers, not illustrated in the drawing, and the like are provided on a second surface side of the semiconductor layer 2a.

Wire layer 2b (on the first substrate 2 side)

The wire layer 2b provided on the semiconductor layer 2a in the first substrate 2 includes transportation gates TG, gate electrodes 27 of the transistors Tr, and, furthermore, other electrodes, not illustrated in the drawing, all of which are provided through a gate insulating film 25, on an interface side with the semiconductor layer 2a. The transportation gates TG and the gate electrode 27 are covered with an interlayer insulating film 29, and embedded wires 31 are provided in a groove pattern formed in the interlayer insulating film 29. The embedded wire 31 is made up of a barrier metal layer 31a that covers the inner wall of the groove pattern and a wire layer 31b made of copper (Cu) embedded in the groove pattern through the barrier metal layer 31a.

Meanwhile, the above-described wire layer 2b may be made up of multilayered wire layers in which the wire layers are stacked.

Electrode layer 2c (on the first substrate 2 side)

The electrode layer 2c provided on the wire layer 2b in the first substrate 2 includes a diffusion-preventing insulating film 32 against copper (Cu) and a first insulating film 35 stacked on the diffusion-preventing insulating film on an interface side with the wire layer 2b. The first insulating film 35 is made of, for example, a TEOS film, and first electrodes 33 are provided as embedded electrodes in the groove pattern formed in the first insulating film 35. Meanwhile, the TEOS film refers to a silicon oxide film formed using chemical vapor deposition (hereinafter CVD) in which tetraethoxy silane (TEOS) gas having a composition of $Si(OC_2H_5)_4$ is used as raw material gas.

In addition, the first electrode 33 is made up of a barrier metal layer 33a that covers the inner wall of the groove pattern and a first electrode film 33b made of copper (Cu) embedded in the groove pattern through the barrier metal layer 33a. In addition, it is necessary to form at least copper (Cu) that forms the electrode layer 2c which serves as a surface to be attached at a temperature lower than the thermal treatment temperature after attachment. The surface of the electrode layer 2c having the above-described configuration serves as the attaching surface 41 on the first substrate 2 side with respect to the second substrate 7. The attaching surface 41 is configured to expose the first electrodes 33 and the first insulating film 35, and is flattened through, for example, chemical mechanical polishing (hereinafter referred to as CMP).

Meanwhile, while not illustrated in the drawings, a part of the groove pattern provided in the first insulating film 35 reaches the embedded wires 31 provided in the wire layer 2b, and the first electrodes 33 embedded in the groove pattern are connected to the embedded wires 31 as necessary.

Semiconductor layer 7a (on a second substrate 7 side)

Meanwhile, the semiconductor layer 7a on the second substrate 7 side is obtained by, for example, making a semiconductor substrate 50 made of single-crystal silicon into a thin film. In the semiconductor layer 7a, sources and drains 51 of transistors Tr, furthermore, other impurity layers, not illustrated in the drawing, and the like are provided on a surface layer on the first substrate 2 side.

Wire layer 7b (on the second substrate 7 side)

The wire layer 7b provided on the semiconductor layer 7a in the second substrate 7 includes gate electrodes 55 and, furthermore, other electrodes, not illustrated in the drawing, all of which are provided through a gate insulating film 53, on an interface side with the semiconductor layer 7a. The gate electrodes 55 and other electrodes are covered with an interlayer insulating film 57, and embedded wires 59 are provided in a groove pattern formed in the interlayer insulating film 57. The embedded wire 59 is made up of a barrier metal layer 59a that covers the inner wall of the groove pattern and a wire layer 59b made of copper (Cu) embedded in the groove pattern through the barrier metal layer 59a.

Meanwhile, the above-described wire layer 7b may have a multilayered wire layer structure.

Electrode Layer 7c (on the Second Substrate 7 Side)

The electrode layer 7c provided on the wire layer 7b in the second substrate 7 includes a diffusion-preventing insulating film 61 against copper (Cu) and a second insulating film 69 stacked on the diffusion-preventing insulating film on an interface side with the wire layer 7b. The second insulating film 69 is made of, for example, a TEOS film, and second electrodes 67 are provided as embedded electrodes in the groove pattern formed in the second insulating film 69. The second electrode 67 is made up of a barrier metal layer 67a that covers the inner wall of the groove pattern and a second electrode film 67b made of copper (Cu) embedded in the groove pattern through the barrier metal layer 67a.

In addition, similarly to the first substrate 2, it is necessary to form at least copper (Cu) that forms the electrode layer 7c which serves as a surface to be attached at a temperature lower than the thermal treatment temperature after attachment. The second electrodes 67 are disposed so as to correspond to the first electrodes 33 on the first substrate 2 side, and are electrically connected to the first electrodes 33 on the first substrate 2 side through the insulating thin film 12. The surface of the above-described electrode layer 7c serves as the attaching surface 71 on the second substrate 7 side with respect to the first substrate 2. The attaching surface 71 is configured to expose the second electrodes 67 and the second insulating film 69, and is flattened through, for example, CMP.

Insulating Thin Film 12

The insulating thin film 12 is sandwiched between the attaching surface 41 on the first substrate 2 side and the attaching surface 71 on the second substrate 7 side, and covers the entire attaching surface 41 and the entire attaching surface 71. That is, the first substrate 2 and the second substrate 7 are attached together through the insulating thin film 12. When the first substrate 2 and the second substrate 7 attached together are thermally treated at a temperature higher than the film-forming temperature of copper (Cu), the crystal grains of copper (Cu) migrate, and it becomes possible to break the insulating thin film. As the difference between the thermal treatment temperature at this time and the film-forming temperature of copper (Cu) increases, it is more likely that the insulating thin film 12 is broken. This is because the crystal grains of copper (Cu) grow more rapidly. In addition, since the insulating thin film 12 is broken only at places where copper (Cu) is present, portions other than the electrodes can hold an insulating property.

The above-described insulating thin film 12 is made of, for example, an oxidized film and a nitride film, and an oxidized film and a nitride film, which are generally used for semiconductors, are used. However, since the insulating thin film 12 is broken due to the crystal grain growth of the attached copper (Cu) as described above, it is necessary to prevent the crystal grain growth of the copper (Cu) from being accelerated when forming the insulating thin film 12. Thus, examples of the above described film-formation include the film-formation of the copper (Cu). It is necessary to set to a temperature that is equal to or lower than the temperature when forming the electrodes on a joining surface. The constituent materials of the insulating thin film 12 will be described in detail.

In a case in which the insulating thin film 12 is made of an oxidized film, for example, silicon oxide ($SiO_2$) or hafnium oxide ($HfO_2$) is used.

In a case in which the insulating thin film 12 is made of a nitride film, for example, silicon nitride (SiN) is used.

In addition, particularly in the present embodiment, it is important that the first electrodes 33 on the first substrate 2 side and the second electrodes 67 on the second substrate 7 side are attached together through the insulating thin film 12, then, thermally treated, and the insulating thin film 12 in the electrode portions are broken, whereby the electrodes are directly connected to each other. Thus, the film thickness of the insulating thin film 12 is extremely thin. While the film thickness varies depending on the material of the insulating thin film 12, the film thickness is desirably approximately 1 nm or less for, for example, oxides such as silicon oxide ($SiO_2$) and hafnium oxide ($HfO_2$) and most of other materials. The above-described film thickness is determined based on the amount of the surface of copper (Cu) changed due to the crystal grain growth in a case in which, for example, a copper (Cu) film is formed at a film-forming temperature of 150° C. and then thermally treated at 400° C. However, it is also possible to use a thicker film depending on the film qualities of the insulating thin film 12 and the temperature difference between the film-forming temperature and the thermal treatment temperature. The first electrode 33 and the second electrode 67 which are brought into direct contact using the above-described method form a perfect conduction state so that a current flows.

Meanwhile, in the semiconductor device 1 of the present embodiment, the insulating thin film 12 is not limited to the above-described monolayer structure, and may have a laminate structure made of the same material or a laminate structure made of different materials.

Protective Film 15, Color Filter Layer 17 and On-Chip Lens 19

The protective film 15 is provided to cover the photoelectric conversion portions 21 on the first substrate 2. The protective film 15 is made of a material film having a passivation property, and examples of the material film being used include a silicon oxide film, a silicon nitride film, a silicon oxynitride film and the like.

The color filter layer 17 is made up of color filters of the respective colors provided on a one-to-one basis to the respective photoelectric conversion portions 21. There is no limitation in how to array the color filters of the respective colors.

The on-chip lenses 19 are provided on a one-to-one basis to the respective photoelectric conversion portions 21 and the color filters of the respective colors that configure the color filter layers 17, and are configured to collect the incident light in the respective photoelectric conversion portions 21.

The effect of the configuration of the semiconductor device of the present embodiment The semiconductor device 1 of the present embodiment configured as described above is formed of the first substrate 2 and the second substrate 7 attached through the insulating thin film 12 as illustrated in FIG. 2 so that the attaching surface 41 of the first substrate 2 and the attaching surface 71 of the second substrate 7 are not in direct contact. Thus, the generation of voids generated in a joining interface in a configuration in which the attaching surfaces are directly jointed together is prevented. Then, the joining strength between two substrates increases so that it becomes possible to obtain semiconductor devices having improved reliability.

Particularly in a case in which the first insulating film 35 and the second insulating film 69 are made of TEOS films, since a number of OH groups are present on the surface of the TEOS film, in a joining interface in which the insulating films made of the TEOS film come into direct contact with each other, voids are generated due to dehydration synthesis.

Even in a case in which the insulating film is the TEOS film as described above, in the semiconductor device 1 of the present embodiment, since the substrates are attached together through the insulating thin film 12, there is no case in which the TEOS films come into direct contact with each other, and it is possible to prevent the generation of voids due to dehydration synthesis. Then, the joining strength between two substrates increases so that it becomes possible to obtain semiconductor devices having improved reliability.

Figure 3A:
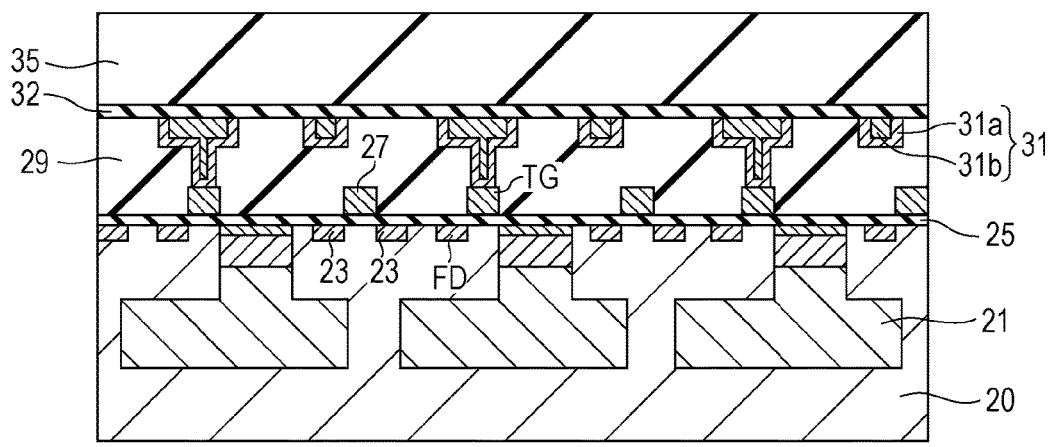
FIGS. 3A, 3B and 3C are cross-sectional process charts illustrating a (first) production order of a first substrate (sensor substrate) when manufacturing the semiconductor device according to the present embodiment.
Figure 3B:
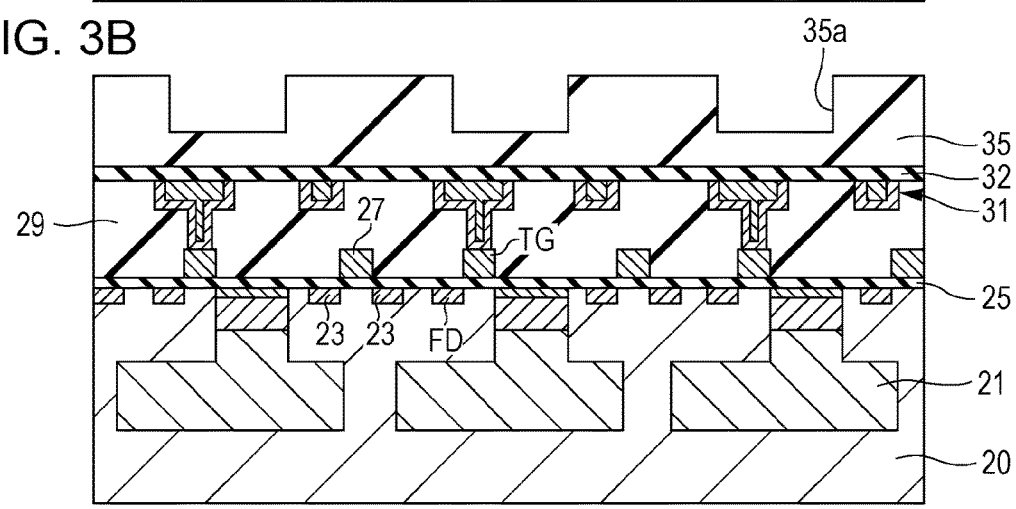
Figure 3C:
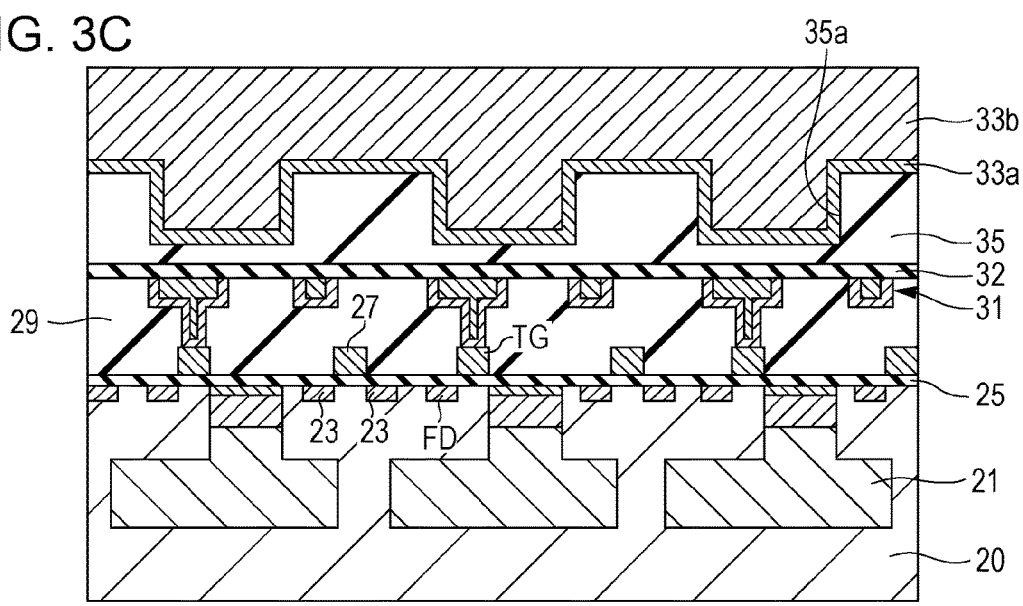

3. A production order of a first substrate (sensor substrate) in manufacturing the semiconductor device of the present embodiment FIGS. 3A, 3B and 3C are (first) cross-sectional process charts illustrating a production order of the first substrate 2 used when manufacturing the above-described semiconductor device of the present embodiment, and FIGS. 4A and 4B are (second) cross-sectional process charts subsequent to FIGS. 3A, 3B and 3C. Hereinafter, the production order of the first substrate 2 (sensor substrate) used in the present embodiment will be described based on the above-described drawings.

As illustrated in FIG. 3A, the semiconductor substrate 20 made of, for example, single-crystal silicon is prepared. The photoelectric conversion portions 21 made of an n-type impurity layer are formed at a predetermined depth in the semiconductor substrate 20, and a charge transportation portion made of an $n^+$-type impurity layer or a charge storage portion for holes made of a $p^+$-type impurity layer are formed on the surface layer of the photoelectric conversion portion 21. In addition, floating diffusions FD made of an $n^+$-type impurity layer, sources and drains 23, and, furthermore, other impurity layers, not illustrated in the drawing, are formed on the surface layer of the semiconductor substrate 20.

Next, the gate insulating film 25 is formed on the semiconductor substrate 20, and, furthermore, the transportation gates TG and the gate electrodes 27 are formed on the gate insulating film. Here, the transportation gate TG is formed between the floating diffusion FD and the photoelectric conversion portion 21, and the gate electrodes 27 is formed between the source and the drain 23. In addition, other electrodes, not illustrated in the drawing, are formed using the same processes as described above.

Meanwhile, the above-described processes may be carried out in an appropriately-selected ordinary production order.

After that, the interlayer insulating film 29 made of, for example, silicon oxide is formed on the gate insulating film 25 in a state in which the transportation gates TG and the gate electrodes 27 are covered. Furthermore, a groove pattern is formed in the interlayer insulating film 29, and the embedded wires 31 formed by embedding the wire layer 31b through the barrier metal layer 31a are formed in the groove pattern. The embedded wires 31 are connected to the transportation gates TG at necessary places. In addition, while not illustrated in the drawing, some of the embedded wires 31 are connected to the sources and drains 23 at necessary places. Then, the wire layer 2b including the embedded wires 31 is obtained. Meanwhile, an embedded wiring technique, which will be described using drawings including FIG. 3B, is applied to the formation of the embedded wires 31.

Next, the diffusion-preventing insulating film 32 is formed on the wire layer 2b, and, furthermore, the first insulating film 35 is formed on the diffusion-preventing insulating film. For example, the first insulating film 35 made of the TEOS film is formed using CVD in which TEOS gas is used. After that, the first electrodes 33 are formed on the first insulating film 35 using the embedded wiring technique described below.

As illustrated in FIG. 3B, a groove pattern 35a is formed in the first insulating film 35. While not illustrated in the drawing, the groove pattern 35a is formed at necessary places in a shape that allows the groove pattern to reach the embedded wires 31.

As illustrated in FIG. 3C, the barrier metal layers 33a are formed in a state in which the inner walls of the groove pattern 35a are covered, and the first electrode film 33b is formed on the barrier metal layers in a state in which the groove pattern 35a is embedded. The barrier metal layer 33a is made of a material having a barrier property so as to prevent the first electrode film 33b from diffusing into the first insulating film 35. Meanwhile, the first electrode film 33b is made of copper (Cu), but the material is not limited thereto, and the first electrode film may be made of any conductive material.

As illustrated in FIG. 4D, the first electrode film 33b is removed and flattened using CMP until the barrier metal layers 33a are exposed, and, furthermore, the barrier metal layers 33a are removed and flattened until the first insulating film 35 is exposed. Then, the first electrodes 33 formed by embedding the first electrode film 33b in the groove pattern 35a through the barrier metal layer 33a are formed. Then, the electrode layer 2c including the first electrodes 33 is obtained.

Through the above-described processes, the first substrate 2 including the flat attaching surface 41 on which the first electrodes 33 and the first insulating film 35 are exposed is produced as the sensor substrate. Meanwhile, a pretreatment may be carried out on the attaching surface 41 as necessary using a wet treatment or a plasma treatment.

The above-described processes may be carried out using an ordinary process order for manufacturing semiconductor devices, and the process order is not particularly limited, and it is possible to carry out the processes in an appropriate order. However, when forming the first electrodes 33 which serve as the attaching surface, the film-forming temperature of copper (Cu) is, for example, as low as approximately 100° C., and the temperature difference with the thermal treatment temperature (for example, 400° C.) after attachment is made to be as large as possible. In the present disclosure, the following formation of an insulating thin film forms characteristics processes.

The film-forming order of an insulating thin film

As illustrated in FIG. 4E, an insulating thin film 12a is formed using atomic layer deposition (hereinafter, referred to as ALD) in a state in which the attaching surface 41 of the first substrate 2 is fully covered.

The order of ALD will be briefly described.

First, a first reactant and a second reactant, both of which contain the constituent elements of a thin film to be formed, are prepared. A first process, in which gas containing the first reactant is supplied to a substrate and an adsorption reaction is caused, and a second process, in which gas containing the second reactant is supplied and an adsorption reaction is caused, are carried out as film-forming processes, and an inert gas is supplied so as to purge the non-adsorbed reactants between both processes. One cycle of the above-described film-forming processes accumulates a layer of atoms, and the film-forming processes are repeated so as to form a film having a desired film thickness. Meanwhile, any one of the first process and the second process may be carried out first.

The above-described film-forming method is ALD, and has the following characteristics.

As described above, ALD is a method in which the cycle of the film-forming processes are repeated so as to form a film, and it is possible to form a film having a film thickness that is highly accurately controlled at an atomic layer level by adjusting the number of the cycles of the processes. When the ALD is applied to form the insulating thin film 12a, it is possible to form the extremely thin insulating thin film 12a with favorable film thickness controllability.

ALD is, furthermore, a method that can form films using a low-temperature process at approximately 500° C. or lower. Furthermore, it also becomes possible to form films of $SiO_2$ or the like at room temperature. When forming the insulating thin film 12a, since the electrode layer 2c has been already formed, it is necessary to consider the heat resistance of metal that configures the electrode layer 2c, and a low-temperature process is necessary to form the insulating thin film 12a. Therefore, when the ALD is applied to form the insulating thin film 12a, it is possible to form the insulating thin film 12a without causing the deterioration of the electrode layer 2c due to the low-temperature process.

As described above, ALD is a method that forms films by accumulating atomic layers one by one. When the ALD is applied to form the insulating thin film 12a, it is possible to cover the entire attaching surface 41 with the flat and uniform insulating thin film 12 without allowing the surface of the substrate which has been highly flattened using CMP to be more uneven.

Hereinafter, as an example, the film-forming conditions of the insulating thin film 12a made of an oxidized film or an nitride film using ALD will be specifically described.

In a case in which the insulating thin film 12a is made of an oxidized film ($SiO_2$, $HfO_2$ or the like), in the ALD, a Si-containing reactant or a Hf-containing reactant is used as the first reactant, and an O-containing reactant is used as the second reactant. When a process in which the above-described reactants are supplied so as to cause an adsorption reaction is alternately repeated, the insulating thin film 12a made of an oxide film ($SiO_2$ or $HfO_2$) is formed on the attaching surface 41. Here, as the Si-containing reactant, for example, a substance that can be supplied in a gas form, such as silane ($SiH_4$) or dichlorosilane ($H_2SiC_{12}$) is used. As the Hf-containing substance, tetrakis dimethyl amino hafnium ($Hf[N(CH_3)_2]_4$) or the like is used. As the O-containing substance, water vapor gas, ozone gas or the like is used.

Meanwhile, in a case in which the insulating thin film 12a is made of a nitride film (SiN or the like), in the ALD, a Si-containing reactant is used as the first reactant, and a N-containing reactant is used as the second reactant. When a process in which the above-described reactants are supplied so as to cause an adsorption reaction is alternately repeated, the insulating thin film 12a made of a nitride film (SiN) is formed on the attaching surface 41. Here, as the N-containing reactant, for example, nitrogen gas, ammonia gas or the like is used. As the O-containing substance, water vapor gas, ozone gas or the like is used.

Through the above-described processes, the extremely thin and uniform insulating thin film 12a is formed on the first substrate 2 in a state in which the insulating thin film covers the entire attaching surface 41.

Figure 5A:
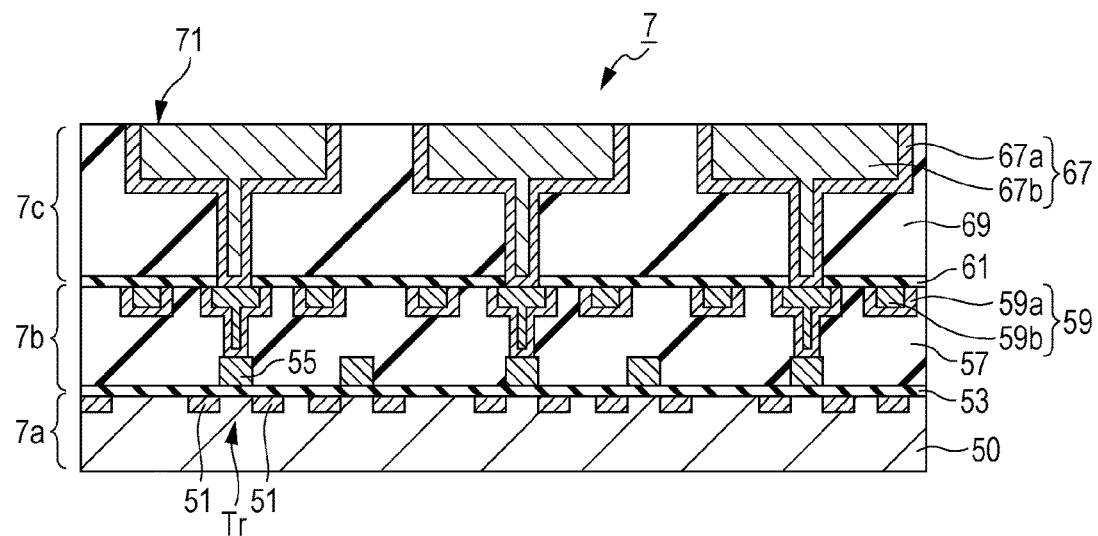
FIGS. 5A and 5B are cross-sectional process charts illustrating a production order of a second substrate (circuit substrate) when manufacturing the semiconductor device according to the present embodiment.
Figure 5B:
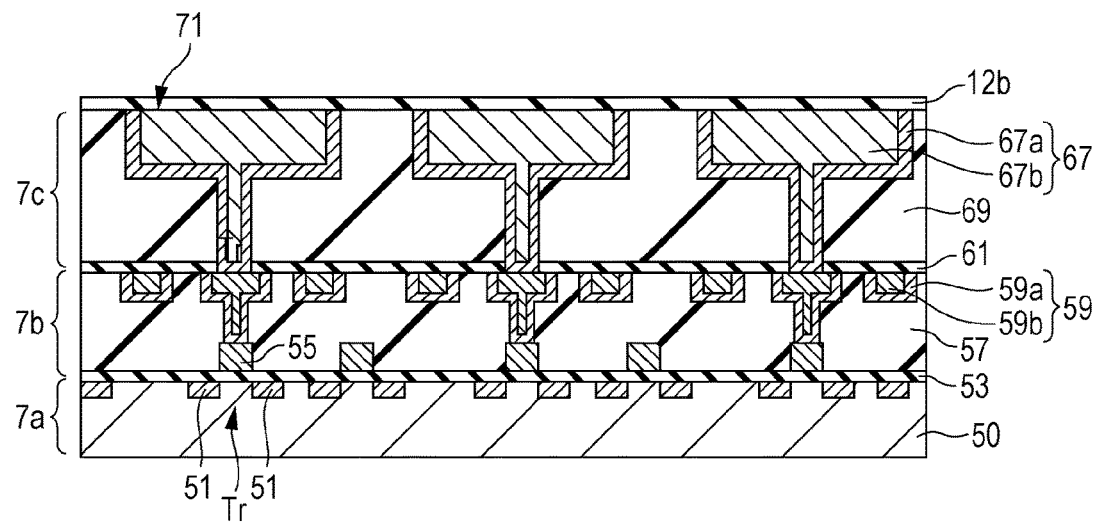

4. A production order of a second substrate (circuit substrate) in manufacturing the semiconductor device of the present embodiment FIGS. 5A and 5B are cross-sectional process charts illustrating a production order of the second substrate 7 used when manufacturing the above-described semiconductor device of the present embodiment. Hereinafter, the production order of the second substrate 7 (circuit substrate) used in the present embodiment will be described based on the drawing.

As illustrated in FIG. 5A, the semiconductor substrate 50 made of, for example, single-crystal silicon is prepared. The respective conduction-type sources and drains 51, and other impurity layers, not illustrated in the drawing, are formed on the surface layer of the semiconductor substrate 50. Then, the semiconductor layer 7*a* is obtained.

Next, the gate insulating film 53 is formed on the semiconductor layer 7*a*, and, furthermore, the gate electrodes 55 are formed on the gate insulating film. Here, the gate electrodes 55 are formed between the sources and drains 51. In addition, other electrodes, not illustrated in the drawing, are formed using the same processes as described above.

Next, the interlayer insulating film 57 made of, for example, silicon oxide is formed on the gate insulating film 53 in a state in which the gate electrodes 55 are covered. The embedded wires 59 formed by embedding the wire layer 59*b* through the barrier metal layer 59*a* are formed in the groove pattern in the interlayer insulating film 57, thereby obtaining the wire layer 7*b* including the embedded wires 59. Similarly to the above-described formation of the first electrodes 33, the embedded wires 59 are formed by applying the embedded wiring technique.

After that, the second insulating film 69 made of, for example, the TEOS film is stacked and formed on the wire layer 7*b* through the diffusion-preventing insulating film 61. Then, the second electrodes 67 formed by embedding the second electrode film 67*b* in the groove pattern in the second insulating film 69 through the barrier metal layer 67*a* are formed, and the electrode layer 7*c* including the second electrodes 67 is obtained. The second electrodes 67 are formed in the same manner as in the above-described formation of the first electrodes 33.

As a result of the above-described processes, the second substrate 7 including the flat attaching surface 71 on which the second electrodes 67 and the second insulating film 69 are exposed is produced as the circuit substrate.

The above-described processes may be carried out using an ordinary process order for manufacturing semiconductor devices, and the process order is not particularly limited, and it is possible to carry out the processes in an appropriate order. However, when forming the second electrodes 67 which serve as the attaching surface, the film-forming temperature of copper (Cu) is, for example, as low as approximately 100° C., and the temperature difference with the thermal treatment temperature (for example, 400° C.) after attachment is made to be as large as possible. In the present disclosure, the following formation of an insulating thin film and the attachment of the substrates form characteristics processes.

As illustrated in FIG. 5B, the insulating thin film 12*b* is formed on the attaching surface 71 using ALD in the same manner as the insulating thin film 12*a* on the first substrate 2 side.

Then, the extremely thin and uniform insulating thin film 12*b* is formed on the second substrate 7 in a state in which the insulating thin film covers the entire attaching surface 71. Meanwhile, the insulating thin film 12*b* may be a different film from or the same film as the insulating thin film 12*a* on the first substrate 2 side.

5. An attachment order of the substrates in manufacturing the semiconductor device of the present embodiment The attachment order of the first substrate 2 having the insulating thin film 12*a* formed on the attaching surface 41 and the second substrate 7 having the insulating thin film 12*b* formed on the attaching surface 71 will be described using FIGS. 6 and 7.

Figure 6:
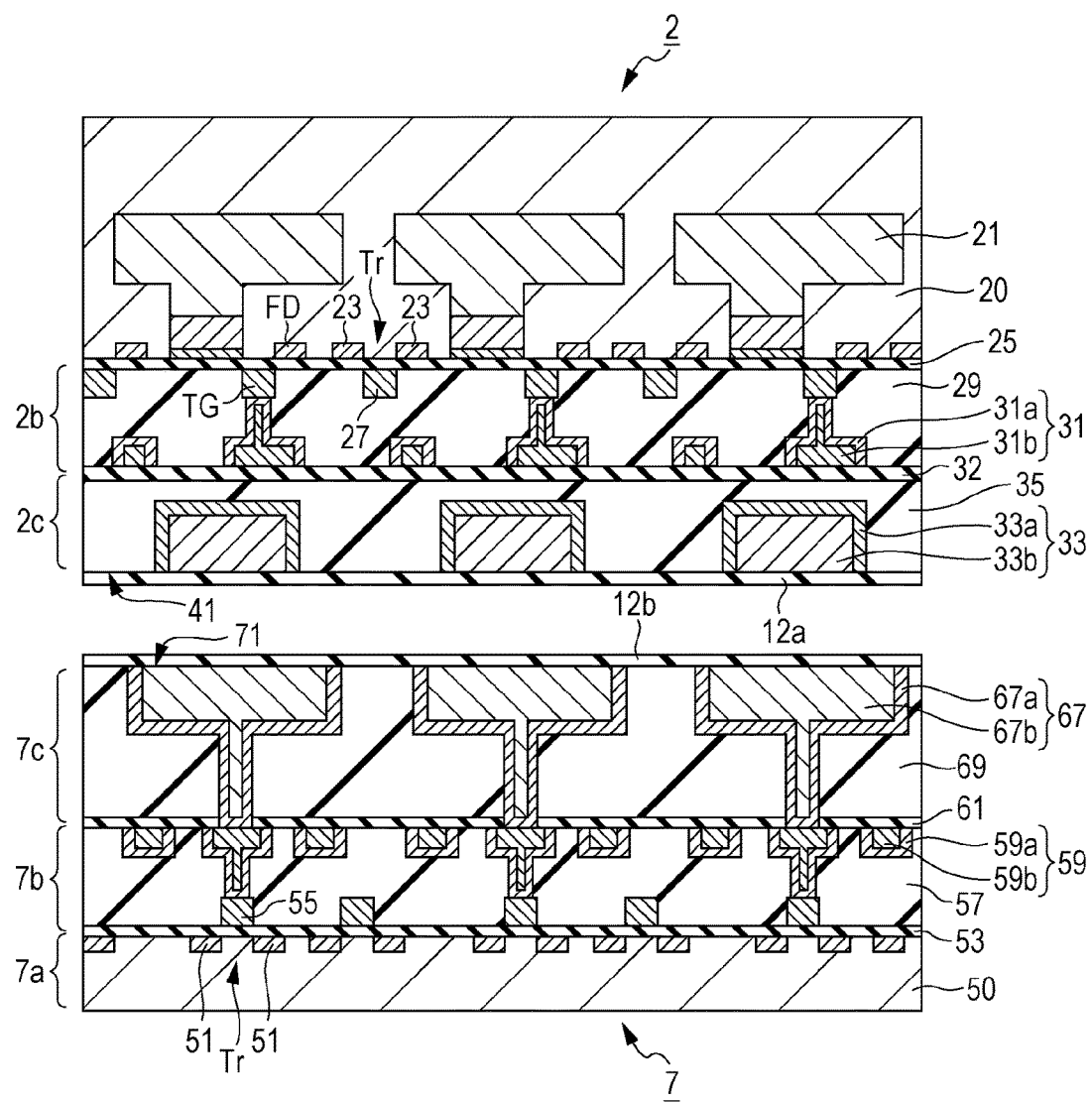
FIG. 6 is a (first) cross-sectional view illustrating attachment when manufacturing the semiconductor device according to the present embodiment.

As illustrated in FIG. 6, the attaching surface 41 of the first substrate 2 and the attaching surface 71 of the second substrate 7 are disposed opposite to each other through the insulating thin film, and, furthermore, the first electrodes 33 in the first substrate 2 and the second electrodes 67 in the second substrate 7 are aligned so as to face each other. In the example illustrated in the drawing, the first electrodes 33 and the second electrodes 67 correspond to each other on a one-to-one basis, but the corresponding state is not limited thereto.

Figure 7:
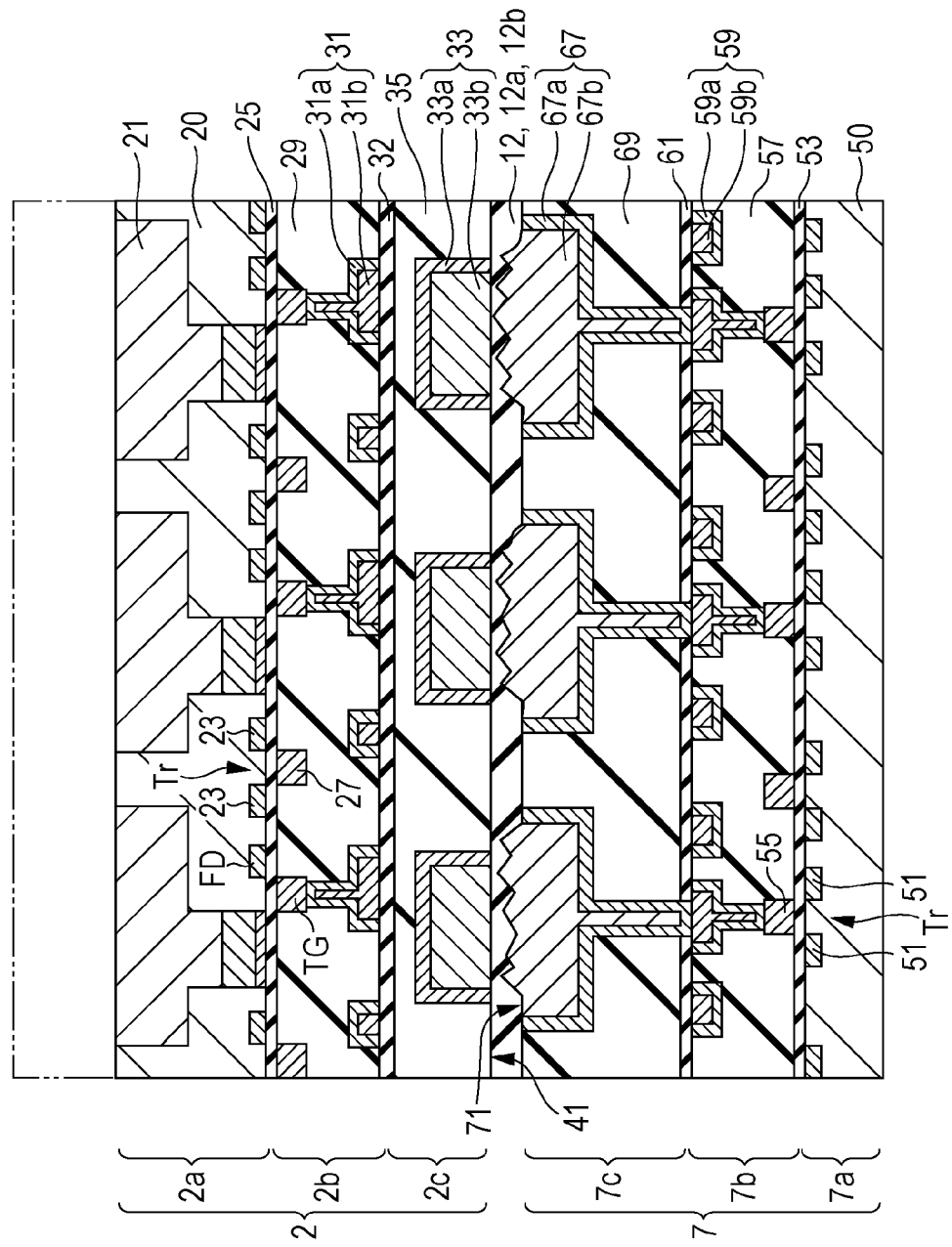
FIG. 7 is a (second) cross-sectional view illustrating attachment when manufacturing the semiconductor device according to the present embodiment.

When the insulating thin film 12*a* on the first substrate 2 and the insulating thin film 12*b* on the second substrate 7 are made to face each other and thermally treated as illustrated in FIG. 7, the insulating thin film 12*a* and the insulating thin film 12*b* are joined together. The above-described thermal treatment is carried out at a temperature for a time under which elements and wires formed in the first substrate 2 and the second substrate 7 are not influenced and the insulating thin films 12 are sufficiently joined. Furthermore, at this time, the crystal grain growth of copper (Cu) occurs, and the insulating thin films 12 between the first electrodes 33 and the second electrodes 67 break from both sides. Then, copper (Cu) in the electrodes comes into direct contact with each other.

For example, in a case in which the first electrodes 33 and the second electrodes 67 are made of a material mainly containing copper (Cu), the thermal treatment is carried out at a temperature in a range of 200° C. to 600° C. for approximately 15 minutes to 5 hours. The above-described thermal treatment may be carried out in a pressurized atmosphere or may be carried out in a state in which the first substrate 2 and the second substrate 7 are pressurized from both surface sides. As an example, when the thermal treatment is carried out at 400° C. for 4 hours, the first electrodes 33 and the second electrodes 67 having the insulating thin films 12 therebetween are connected to each other. Then, the insulating thin film 12*a* and the insulating thin film 12*b* are joined, and the first substrate 2 and the second substrate 7 are attached. Here, as the temperature difference between the temperature during the formation of the copper (Cu) film and the thermal treatment temperature increases, since it is possible to accelerate the crystal grain growth of copper (Cu), the insulating thin films 12 become easily breakable.

Here, in a case in which the insulating thin films 12*a* and 12*b* are formed on both attaching surfaces 41 and 71 of the first substrate 2 and the second substrate 7 as described above, the insulating thin films 12*a* and 12*b* may be made of the same material or different materials.

Meanwhile, in the method for manufacturing semiconductor devices of the present embodiment, the insulating tin film may be formed on the attaching surface of only any substrate of the first substrate 2 and the second substrate 7. For example, the first substrate 2 and the second substrate 7 may be attached together by forming the insulating thin film 12*a* only on the attaching surface 41 of the first substrate 2 and joining the insulating thin film 12*a* on the first substrate 2 side and the attaching surface 71 on the second substrate 7 side.

As described above, after the first substrate 2 and the second substrate 7 are attached, the thickness of the semiconductor substrate 20 on the first substrate 2 side is decreased so as to produce the semiconductor layer 2*a*, and the photoelectric conversion portions 21 are exposed. In addition, if necessary, the thickness of the semiconductor substrate 50 may be decreased in the semiconductor layer 7*a* on the second substrate 7 side.

After that, the protective film 15 is formed on the exposed surfaces of the photoelectric conversion portions 21 in the first substrate 2 as illustrated in FIG. 2, and, furthermore, the color filter layers 17 and the on-chip lenses 19 are formed on the protective film 15, thereby completing the semiconductor device (solid imaging apparatus) 1.

The effect of the method for manufacturing semiconductor devices of the present embodiment In the above-described method for manufacturing semiconductor devices of the present embodiment, the insulating thin films 12*a* and 12*b* are respectively formed on the first substrate 2 and the second substrate 7, and the surfaces on which the insulating thin films 12*a* and 12*b* are formed are joined together, thereby attaching the first substrate 2 and the second substrate 7. Thus, compared with a case in which the attaching surfaces 41 and 71 which are flattened through CMP are directly joined, the semiconductor device 1 of the present embodiment in which the first substrate 2 and the second substrate 7 are joined together by joining the surfaces on which the insulating thin films 12*a* and 12*b* are formed has a favorable joining property. Meanwhile, even in a case in which the insulating thin film 12*a* is formed only on the attaching surface 41 of the first substrate 2, the insulating thin film 12*a* on the first substrate 2 side and the attaching surface 71 on the second substrate 7 side are joined together so that the joining property of the substrates is favorable compared with a case in which the attaching surfaces 41 and 71 are directly joined together.

For example, in the attaching surfaces 41 and 71 which have been flattened through CMP, there is a possibility of the first insulating film 35 and the second insulating film 69 that configure the attaching surfaces 41 and 71 containing water in the CMP process. In addition, in a case in which the first insulating film 35 and the second insulating film 69 that configure the attaching surfaces 41 and 71 are made of the TEOS films, the first insulating film 35 and the second insulating film 69 are originally formed as films having a high water content rate due to the film-forming conditions of the TEOS films. Therefore, in a case in which the above-described attaching surfaces 41 and 71 containing water are directly joined together, during the thermal treatment after the joining, exhausted gas concentrates in the joining interface, and voids are formed. However, in the present embodiment, since the entire attaching surfaces 41 and 71 are covered with the insulating thin films 12*a* and 12*b*, it is possible to prevent the concentration of exhausted gas in the joining interface and to suppress the generation of voids.

Particularly, in a case in which the insulating thin film 12*a* on the attaching surface 41 of the first substrate 2 and the insulating thin film 12*b* on the attaching surface 71 of the second substrate 7 are made of the same material, since the films made of the same material are joined together, stronger joining is possible. Then, the joining strength between the substrates increases so that it is possible to obtain semiconductor devices having improved reliability.

Furthermore, since the insulating thin films 12*a* and 12*b* are formed through ALD, the following effects are also obtained.

First, since ALD is a method exhibiting favorable film thickness controllability due to the film formation on an atomic layer level, it is possible to form extremely thin insulating thin films. Then, even in a structure in which the first electrodes 33 on the first substrate 2 side and the second electrodes 67 on the second substrate 7 side are disposed opposite to each other through the insulating thin films 12, since the insulating thin films 12 are extremely thin, the electrical connection between the first electrodes 33 and the second electrodes 67 becomes possible.

Next, since ALD is a method exhibiting favorable film thickness controllability due to the film formation on an atomic layer level, the flatness of the attaching surfaces 41 and 71 that have been flattened through CMP is maintained, and the uniform insulating thin films 12*a* and 12*b* are formed on the first substrate 2 and the second substrate 7. Since the flat joining surfaces on which the insulating thin films 12*a* and 12*b* are formed are joined together as described above, the joining surfaces are joined together with excellent adhesiveness so that the joining of the substrates having improved joining strength becomes possible.

Next, since ALD is a method that forms films using a low-temperature process, there is no case in which metal that configures the electrode layer 2*c* on the first substrate 2 side and the electrode layer 7*c* on the second substrate 7 side is deteriorated due to high heat, and it is possible to form the insulating thin films 12*a* and 12*b* on the first substrate 2 and the second substrate 7. Thus, ALD is suitable for the purpose of accelerating the crystal grain growth of copper (Cu) using a thermal treatment after attachment which is a core of the present disclosure. Thus far, advantages of the use of ALD have been described, but the method for forming films is not limited to ALD, and the method may be CVD as long as the above-described advantages can be realized. Furthermore, in addition to the formation of films using gas-phase growth in which gas is used, the films may be formed using, for example, a coating method or the like as long as thin films that can realize the principles of the present disclosure can be formed.

Finally, since ALD is a method that forms films at an atomic layer level, the formed insulating thin films 12*a* and 12*b* are dense films and have an extremely low water content rate. Since the joining surfaces on which the insulating thin films 12*a* and 12*b* having a low water content rate are formed are joined together, there is no concern that voids may be generated in the joining surface.

Through the above-described processes, the joining strength between the substrates increases so that semiconductor devices having improved reliability can be obtained.

6. An example of an electronic device for which the semiconductor device of the present embodiment is used The semiconductor device (solid imaging apparatus) according to the present disclosure described in the present embodiment can be applied to, for example, electronic devices such as camera systems such as digital cameras and video cameras, furthermore, mobile phones having an imaging function, and other devices having an imaging function.

Figure 8:
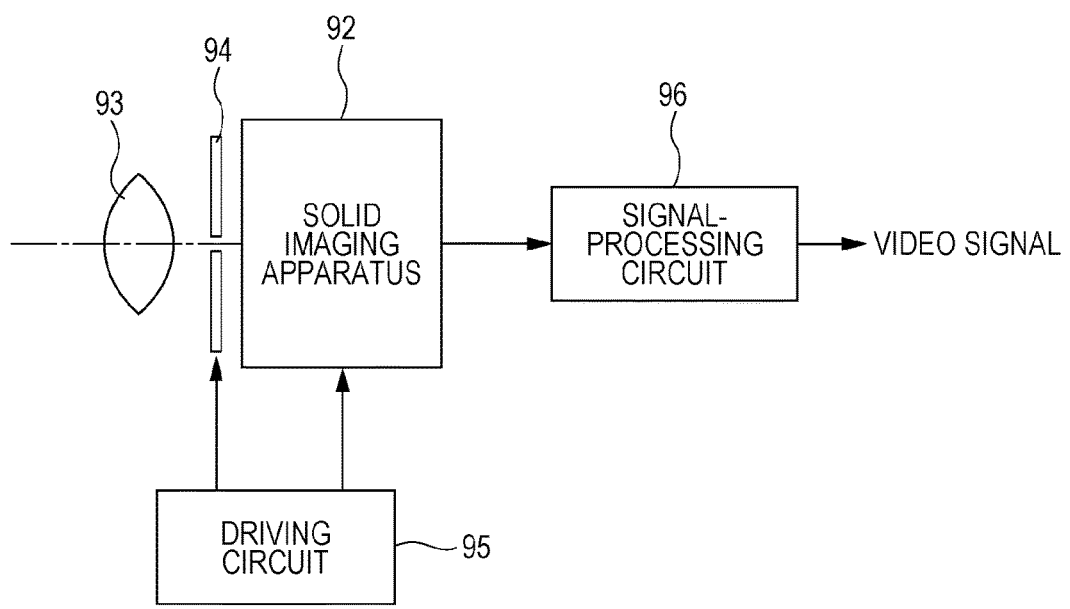
FIG. 8 is a configuration view of an electronic device for which a semiconductor device obtained by applying the present disclosure is used.

FIG. 8 illustrates a configuration view of a camera in which the solid imaging apparatus is used as an example of the electronic devices according to the present disclosure. A camera 91 according to the present embodiment is an example of a video camera that can shoot still images or video clips. The camera 91 includes a solid imaging apparatus 92, an optical system 93 that guides the incident light to a photoelectric conversion portion in the solid imaging apparatus 92, a shutter apparatus 94, a driving circuit 95 for driving the solid imaging apparatus 92, and a signal-processing circuit 96 that treats the output signals of the solid imaging apparatus 92.

To the solid imaging apparatus 92, a semiconductor device (1) having a configuration described in the present embodiment is applied. The optical system (optical lens) 93 forms image light (incident light) from an object on an imaging surface of the solid imaging apparatus 92. Then, signal charges are stored in the solid imaging apparatus 92 for a certain period. The above-described optical system 93 may be an optical lens system made up of a plurality of optical lenses. The shutter apparatus 94 controls the light radiation period to the solid imaging apparatus 92 and the light-shutting period. The driving circuit 95 supplies driving signals to the solid imaging apparatus 92 and the shutter apparatus 94, controls the signal output operation of the solid imaging apparatus 92 to the signal-processing circuit 96 using the supplied driving signals (timing signals), and controls the shutter operation of the shutter apparatus 94. That is, the driving circuit 95 supplies driving signals (timing signals) so as to carry out a signal transmission operation from the solid imaging apparatus 92 to the signal-processing circuit 96. The signal-processing circuit 96 carries out a variety of signal processes with respect to signals transmitted from the solid imaging apparatus 92. Image signals which have been signal-processed are stored in a storage medium such as a memory, or are outputted to a monitor.

According to the electronic device of the present embodiment described above, since the highly reliable three-dimensionally structured semiconductor device 1 in which the sensor substrate and the circuit substrate are stacked is used as the solid imaging apparatus, it becomes possible to decrease the size of electronic devices having an imaging function and to improve reliability.

Meanwhile, the present disclosure can employ the following configurations.

(1) A semiconductor device including: a first substrate having an attaching surface on which first electrodes and a first insulating film are exposed; an insulating thin film that covers the attaching surface of the first substrate; and a second substrate which has an attaching surface on which second electrodes and a second insulating film are exposed and is attached to the first substrate in a state in which the attaching surface of the second substrate and the attaching surface of the first substrate are attached together sandwiching the insulating thin film therebetween, and the first electrodes and the second electrodes deform and break a part of the insulating thin film so as to be directly electrically connected to each other.

(2) The semiconductor device according to (1), in which the insulating thin film is an oxidized film.

(3) The semiconductor device according to (1), in which the insulating thin film is a nitride film.

(4) The semiconductor device according to any one of (1) to (3), in which the insulating thin film has a laminate structure.

(5) The semiconductor device according to any one of (1) to (4), in which the insulating thin film is provided in a state of covering the entire attaching surfaces.

(6) The semiconductor device according to any one of (1) to (5), in which the attaching surface of the first substrate and the attaching surface of the second substrate are flattened surfaces.

(7) A manufacturing method including: preparing two substrates having an attaching surface on which electrodes and an insulating film are exposed; forming an insulating thin film in a state in which the attaching surface of at least one of the two substrates is covered; disposing the attaching surfaces of the two substrates opposite to each other through the insulating thin film and aligning the attaching surfaces in a state in which the electrodes on the two substrates are electrically connected to each other through the insulating thin film, thereby attaching the two substrates.

(8) The manufacturing method according to (7), in which the two attached substrates are thermally treated so that the insulating thin film sandwiched by the first electrodes and the second electrodes is broken by deforming and moving metal that configures the electrodes, thereby bringing the first electrodes and the second electrodes into direct contact.

(9) The manufacturing method according to (8), in which a temperature of the thermal treatment is sufficiently lower than a film-forming temperature of at least one of the first electrodes and the second electrodes.

(10) The manufacturing method according to (7), n which the insulating thin films are formed on both of the two substrates.

(11) The manufacturing method according to (7) or (10), in which the insulating thin films made of the same material are formed on both of the two substrates.

(12) The manufacturing method according to any one of (7) to (11), in which the insulating thin films are formed using atomic layer deposition.

(13) The manufacturing method according to any one of (7) to (12), in which the attaching surfaces of the two substrates are formed using a flattening treatment.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic apparatus comprising:
   a semiconductor device including:
      a first substrate having an attaching surface including a surface of first electrodes and a surface of a first insulating film, wherein the first substrate is a sensor substrate;
      an insulating thin film that covers the attaching surface of the first substrate; and
      a second substrate having an attaching surface including a surface of second electrodes and a surface of a second insulating film,
   wherein the second substrate is attached to the first substrate in a state in which the attaching surface of the second substrate and the attaching surface of the first substrate are attached together, sandwiching the insulating thin film therebetween,
   wherein at least a first one of the first electrodes and at least a first one of the second electrodes are attached together through the insulating thin film,
   wherein the second substrate is a circuit substrate, and
   wherein at least a portion of the first one of the first electrodes is spaced apart from a portion of the first one of the second electrodes by at least a portion of the insulating thin film in a direction perpendicular to the attaching surface of the first substrate.

2. The electronic apparatus of claim 1, wherein the sensor substrate includes a pixel region in which a plurality of pixels are arrayed, wherein each of the pixels includes a photoelectric conversion portion, and wherein the circuit substrate includes at least one of a vertical driving circuit, a column-signal processing circuit, a horizontal driving circuit, and a system control circuit, the electronic apparatus further comprising:
   an optical system, wherein the optical system guides incident light to the pixels; and
   a shutter apparatus.

3. The electronic apparatus according to claim 1, wherein the insulating thin film is an oxidized film.

4. The electronic apparatus according to claim 1, wherein the insulating thin film is a nitride film.

5. The electronic apparatus according to claim 1, wherein the insulating thin film has a laminate structure.

6. The electronic apparatus according to claim 1, wherein the insulating thin film is provided in a state of covering the entire attaching surfaces, and wherein only the attaching surfaces between the electrodes are deformed and broken.

7. The electronic apparatus according to claim 1, wherein the attaching surface of the first substrate and the attaching surface of the second substrate are flattened surfaces.

* * * * *